(12) United States Patent
Liu et al.

(10) Patent No.: US 12,057,291 B2
(45) Date of Patent: Aug. 6, 2024

(54) OXYGEN REDUCTION DEVICE IN ION SOURCE REGION OF INDUCTIVELY COUPLED PLASMA

(71) Applicants: China University of Geosciences, Wuhan (CN); Hangzhou PuYu Technology Development Co., Ltd., Hangzhou (CN)

(72) Inventors: Yongsheng Liu, Wuhan (CN); Xin Jiang, Wuhan (CN); Xiaofeng Xia, Wuhan (CN); Haibo Ding, Wuhan (CN); Wengui Liu, Wuhan (CN); Jie Lin, Wuhan (CN); Chengyi Zhang, Wuhan (CN); Shuimiao Lu, Wuhan (CN); Lifei Chen, Wuhan (CN)

(73) Assignees: China University of Geosciences, Wuhan (CN); Hangzhou PuYu Technology Development Co., Ltd., Hangzhou (CN)

( * ) Notice: Subject to any disclaimer, the term of this patent is extended or adjusted under 35 U.S.C. 154(b) by 148 days.

(21) Appl. No.: 17/976,968

(22) Filed: Oct. 31, 2022

(65) Prior Publication Data
US 2023/0137483 A1    May 4, 2023

(51) Int. Cl.
*H01J 37/32*    (2006.01)
(52) U.S. Cl.
CPC ...... *H01J 37/321* (2013.01); *H01J 37/32449* (2013.01); *H01J 37/32513* (2013.01)

(58) Field of Classification Search
CPC .............. H01J 37/321; H01J 37/32449; H01J 37/32513; Y02P 10/20
See application file for complete search history.

(56) References Cited

FOREIGN PATENT DOCUMENTS

| CN | 207087118 U | * | 3/2018 | ............... B23K 9/32 |
| KR | 20150138126 A | * | 12/2015 | ............. G21C 19/20 |

* cited by examiner

*Primary Examiner* — Abdullah A Riyami
*Assistant Examiner* — Syed M Kaiser
(74) *Attorney, Agent, or Firm* — Kirk A. Wilson; Joseph T. Guy; Patent Filing Specialist Inc.

(57) ABSTRACT

An oxygen reduction device in an ion source region of inductively coupled plasma is provided. The oxygen reduction device includes a torch and an inflation sleeve. An upper end of the inflation sleeve is sealed and sleeved outside the torch, and a lower end of the inflation sleeve and the torch are arranged at an interval to form an inflation gap. An inflation hole communicating with the inflation gap is formed in an outer side wall of the inflation sleeve. An outer side face of the lower end of the inflation sleeve is protruded outwards to form an annular gas guiding protrusion. The annular gas guiding protrusion is configured for being arranged opposite to a sampling cone base arranged below the torch, and a gas outlet gap is formed between the annular gas guiding protrusion and the sampling cone base.

8 Claims, 7 Drawing Sheets

OXYGEN REDUCTION DEVICE IN ION SOURCE REGION OF INDUCTIVELY COUPLED PLASMA

CROSS-REFERENCE TO RELATED APPLICATION

This patent application claims the benefit and priority of Chinese Patent Application No. 202111282219.1, entitled "OXYGEN REDUCTION DEVICE IN ION SOURCE REGION OF INDUCTIVELY COUPLED PLASMA" filed on Nov. 1, 2021, the disclosure of which is incorporated by reference herein in its entirety as part of the present application.

TECHNICAL FIELD

The present disclosure relates to the technical field of inductively coupled plasma mass spectrometry, in particular to an oxygen reduction device in an ion source region of inductively coupled plasma.

BACKGROUND

Inductively Coupled Plasma (ICP) is generated from coupling energy formed by a radio frequency generator applying an electromagnetic field to plasma working gas. The commonly used working gas Ar (IP: 15.8 eV) has very high ionization energy capable of ionizing almost all elements of the periodic table of elements. Thus, ICP has already become the most popular inorganic mass spectrometry source at present by virtue of the outstanding ionization performance. As an ion source in combination with spectroscopy or mass spectrometry, the ICP has the advantages of being wide in range of applicable elements, large in range of assay concentrations, low in detection limits, rapidness, convenience and high in accuracy.

However, ICP ion sources have been widely applied in various respects, and conventional ICP ion sources have a great disadvantage in use. Namely, when a conventional ion source operates in an atmospheric pressure and an air environment, oxygen in air can enter the ion source to form oxides with other elements, so as to severely interfere with accurate determination of an inductively coupled plasma source mass spectrometer for elemental content and isotopic composition. For example, when rare earth elements content is tested, the rare earth elements are easily interfered with oxides, and Ba oxides ($^{137}Ba^{16}O^+$ and $^{135}Ba^{16}O^+$) can severely interfere with Eu determination ($^{153}Eu^+$ and $^{151}Eu^+$). Moreover, the higher oxygen background is one of the main reasons that the oxygen isotope composition is impossibly accurately measured by the inductively coupled plasma source mass spectrometer.

SUMMARY

The present disclosure mainly aims to provide an oxygen reduction device in an ion source region of inductively coupled plasma, and solves the problem that the ion source region of an existing inductively coupled plasma source mass spectrometer is easily interfered with oxygen in the external environment to cause testing inaccuracy.

In order to achieve the above-mentioned purpose, the oxygen reduction device in an ion source region of inductively coupled plasma provided by the present disclosure includes: a torch and an inflation sleeve, where an upper end of the inflation sleeve is sealedly sleeved outside the torch, and a lower end of the inflation sleeve and the torch are arranged at an interval to form an inflation gap; an inflation hole communicating with the inflation gap is formed in an outer side wall of the inflation sleeve; an outer side face of the lower end of the inflation sleeve is protruded outwards to form an annular gas guiding protrusion; the annular gas guiding protrusion is arranged opposite to a base of a sampling cone arranged below the torch, and a gas outlet gap is formed between the annular gas guiding protrusion and the base of the sampling cone; where, inert gas enters the inflation gap from the inflation hole and is discharged through the gas outlet gap to surround an outer side of an ion source flame formed at a tail end of the torch.

In some embodiments, a first annular seal groove may be formed in an inner side face of the upper end of the inflation sleeve, and a first annular seal ring may be adaptively arranged in the first annular seal groove to seal matching surfaces of both the inflation sleeve and the torch.

In some embodiments, the oxygen reduction device in an ion source region of inductively coupled plasma may further include: a flow restrictor, and the flow restrictor may include: a connecting ring, a lower end of the connecting ring may be connected to the base of the sampling cone, and a ring cavity of the connecting ring may be used for an entry of the sampling cone; and a flow restricting ring arranged on an upper end face of the connecting ring and arranged on a circumference of the annular gas guiding protrusion at an interval so as to form a flow restricting gap extending in an up-down direction, and the flow restricting gap may communicate with the gas outlet gap.

In some embodiments, a size of the flow restricting gap may be denoted by H, and a range of the size is larger than or equal to 0.5 mm and smaller than or equal to 1.0 mm.

In some embodiments, the flow restricting ring may be made of ceramics.

In some embodiments, the oxygen reduction device in an ion source region of inductively coupled plasma may further include: a cooling plate, a lower end of the cooling plate may be attached to the base of the sampling cone, and an avoidance through hole for an entry of the sampling cone may be formed in an upper end face of the cooling plate; and the cooling plate may be internally provided with a cooling coil, and a water outlet end and a water inlet end of the cooling coil penetrate through a side wall of the cooling plate.

In some embodiments, the inflation sleeve may include: an inflation ring, an upper end of the inflation ring may be sealedly sleeved outside the torch, a lower end of the inflation ring and the torch may be arranged at an interval, and the inflation hole may be formed in an outer side wall of the lower end of the inflation ring; and a shield cap, the shield cap may be of a cap-shaped structure, the shield cap may include a cap body and a cap peak, the cap body may be sleeved outside the torch, the cap body and the torch may be arranged at an interval, an upper end of the cap body may be in a sealing connection with the lower end of the inflation ring, and the annular gas guiding protrusion may be the cap peak.

In some embodiments, the inflation ring may be made of polyether-ether-ketone; and/or the shield cap may be made of quartz.

In some embodiments, the upper end of the cap body may be sealedly sleeved on an inner side of the lower end of the inflation ring.

In some embodiments, a second annular seal groove may be formed in an inner side face of the lower end of the inflation ring, and a second annular seal ring may be adaptively arranged in the second annular seal groove to seal a matching gap between the lower end of the inflation ring and the upper end of the cap body.

In the technical solutions provided by the present disclosure, the inflation sleeve is sleeved on the outer side of the torch, so that the torch is wrapped with the ion source flame at the tail end in the inflation sleeve, the ion source region is effectively isolated from the external environment, and the interference on the test by oxygen element in the external environment is reduced to a certain extent. Meanwhile, inert gas is filled into the inflation gap through the inflation hole, so that a pressure difference is generated between the ion source flame region and the external environment, and resistance on oxygen element in the external environment into the ion source flame region is caused. The ion source flame region is further isolated from the external environment by surrounding the ion source flame via the inert gas, the oxide yield is greatly reduced, and interference on testing is reduced. Meanwhile, the outer side face of the lower end of the inflation sleeve is protruded outwards to form the annular gas guiding protrusion, so that the inert gas is extended to be ejected outwardly through the gas outlet gap, the distance that the interfered oxygen element in the external environment enters into the ion source flame region is increased, and the oxygen reduction effect is further improved. Based on the same reason, through the technical solutions provided by the present disclosure, the effect of reducing the interference of carbon, hydrogen and nitrogen elements in the external environment on the ion source flame can be achieved.

BRIEF DESCRIPTION OF THE DRAWINGS

To describe the technical solutions in the embodiments of the present disclosure or in the prior art more clearly, the following briefly describes the accompanying drawings required for describing the embodiments or the prior art. Apparently, the accompanying drawings in the following description show some embodiments of the present disclosure, and a person of ordinary skill in the art may still derive other drawings from these accompanying drawings without creative efforts.

Figure 1:
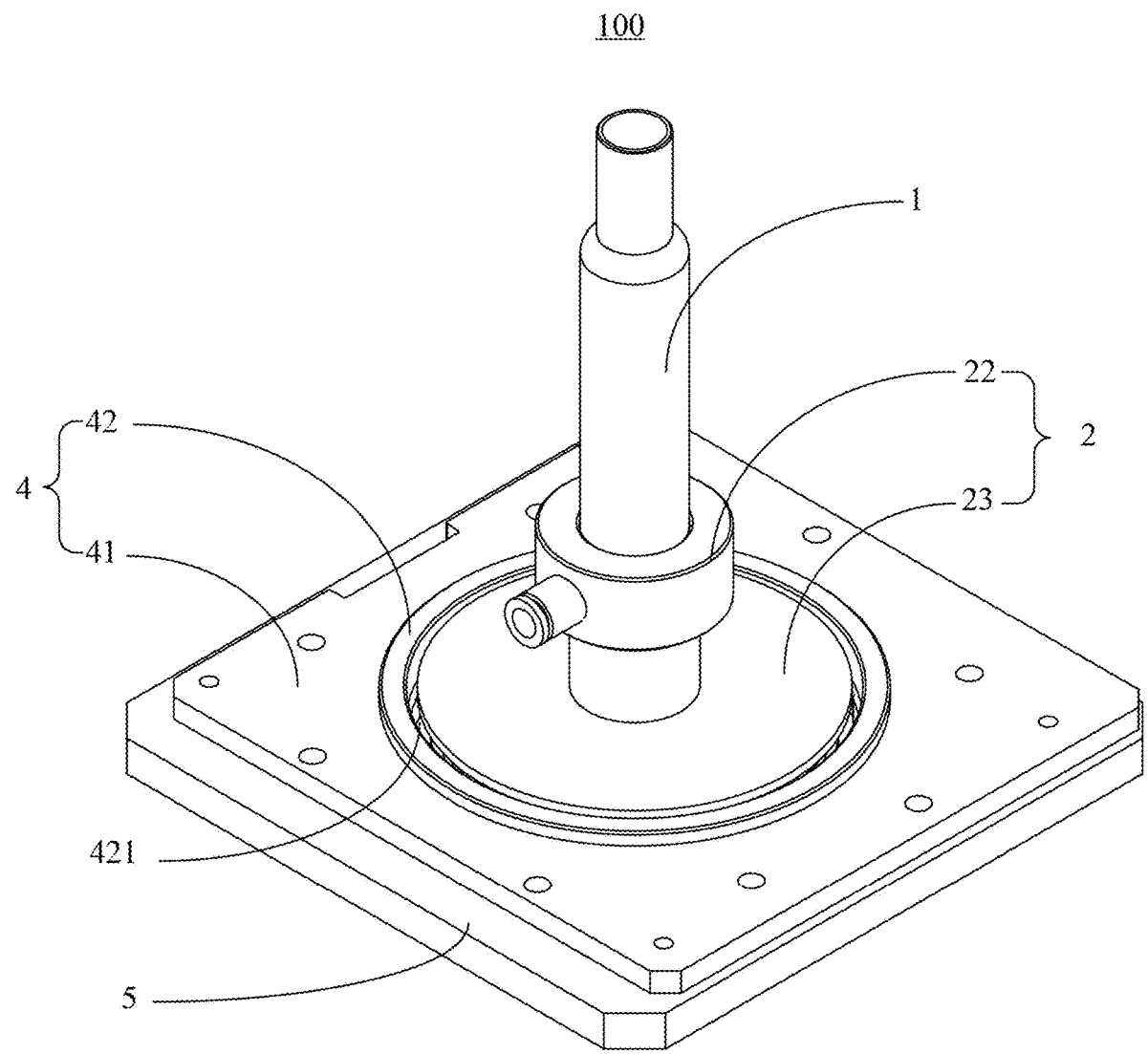
FIG. 1 is a perspective structural schematic diagram of an oxygen reduction device in an ion source region of inductively coupled plasma according to embodiments of the present disclosure.

Reference signs in the accompanying drawings.

| Marks | Names | Marks | Names |
|---|---|---|---|
| 100 | Oxygen reduction device in ion source region of inductively coupled plasma | 232 | Cap peak |
|  |  | 24 | Inflation hole |
|  |  | 3 | Annular gas guiding protrusion |
|  |  | 31 | Gas outlet gap |
| 1 | Torch | 4 | Flow restrictor |
| 11 | Carrier gas inlet | 41 | Connecting ring |
| 12 | Auxiliary gas inlet | 411 | Third annular seal groove |
| 13 | Cooling gas inlet |  |  |
| 2 | Inflation sleeve | 412 | Third annular seal ring |
| 21 | Inflation gap | 42 | Flow restricting ring |
| 22 | Inflation ring | 421 | Flow restricting gap |
| 221 | First annular seal groove | 5 | Cooling plate |
|  |  | 51 | Cooling coil |
| 222 | First annular seal ring | 6 | Sampling cone base |
| 223 | Second annular seal groove | 61 | Sampling cone |
| 224 | Second annular seal ring |  |  |
| 23 | Shield cap |  |  |
| 231 | Cap body |  |  |

The object realization, functional characteristics and advantages of the present disclosure are further described with reference to the accompanying drawings in conjunction with the embodiments.

DETAILED DESCRIPTION OF THE EMBODIMENTS

The following clearly and completely describes the technical solutions in the embodiments of the present disclosure with reference to the accompanying drawings in the embodiments of the present disclosure. Apparently, the described embodiments are merely a part rather than all of the embodiments of the present disclosure. Based on the embodiments in the present disclosure, all other embodiments obtained by those of the ordinary skill in the art under the premise of without creative efforts belong to the scope protected by the present disclosure.

It needs to be noted that if directional indications are involved in the embodiment of the present disclosure, the directional indications are only used for explaining the relative positions and movement conditions of components at a certain specific posture. If the specific posture is changed, the directional indications are also correspondingly changed.

In addition, if the description of "first", "second" and the like is involved in the embodiment of the present disclosure, the description of "first", "second" and the like is used for descriptive purposes only and is not to be understood as indicating or implying relative importance thereof or implying the indication of the number of technical features indicated. Therefore, a feature limited by "first" or "second" may include at least one feature explicitly or implicitly. In addition, technical solutions among the various embodiments may be combined with one another, but must be based on the realization by those skilled in the art, and the combination of the technical solutions should be considered to be absent when such combination is contradictory or impossible to be realized, and is not within the scope of protection claimed by the present disclosure.

Inductively Coupled Plasma (ICP) is generated from coupling energy formed by a radio frequency generator applying an electromagnetic field to plasma working gas.

The commonly used working gas Ar (IP: 15.8 eV) has very high ionization energy capable of ionizing almost all elements of the periodic table of elements. Thus, ICP has already become the most popular inorganic mass spectrometry source at present by virtue of the outstanding ionization performance. As an ion source in combination with spectroscopy or mass spectrometry, the ICP has the advantages of being wide in range of applicable elements, large in range of assay concentrations, low in detection limits, rapidness, convenience and high in accuracy.

However, ICP ion sources have been widely applied in various respects, and conventional ICP ion sources have a great disadvantage in use. Namely, when a conventional ion source operates in an atmospheric pressure and an air environment, oxygen in air can enter the ion source to form oxides with other elements so as to severely interfere with accurate determination of elemental content and isotopic composition in the carrier gas. For example, when rare earth elements are tested, the rare earth elements are easily interfered with oxides, and Ba oxides ($^{137}Ba^{16}O^+$ and $^{135}Ba^{16}O^+$) can severely interfere with Eu determination ($^{153}Eu^+$ and $^{151}Eu^+$). Moreover, the higher oxygen background is one of the main reasons that the oxygen element in the carrier gas is impossibly accurately measured. According to the above analysis, those skilled in the art urgently need a shielding device capable of effectively isolating the region of an ion source flame from the external environment.

Figure 2:
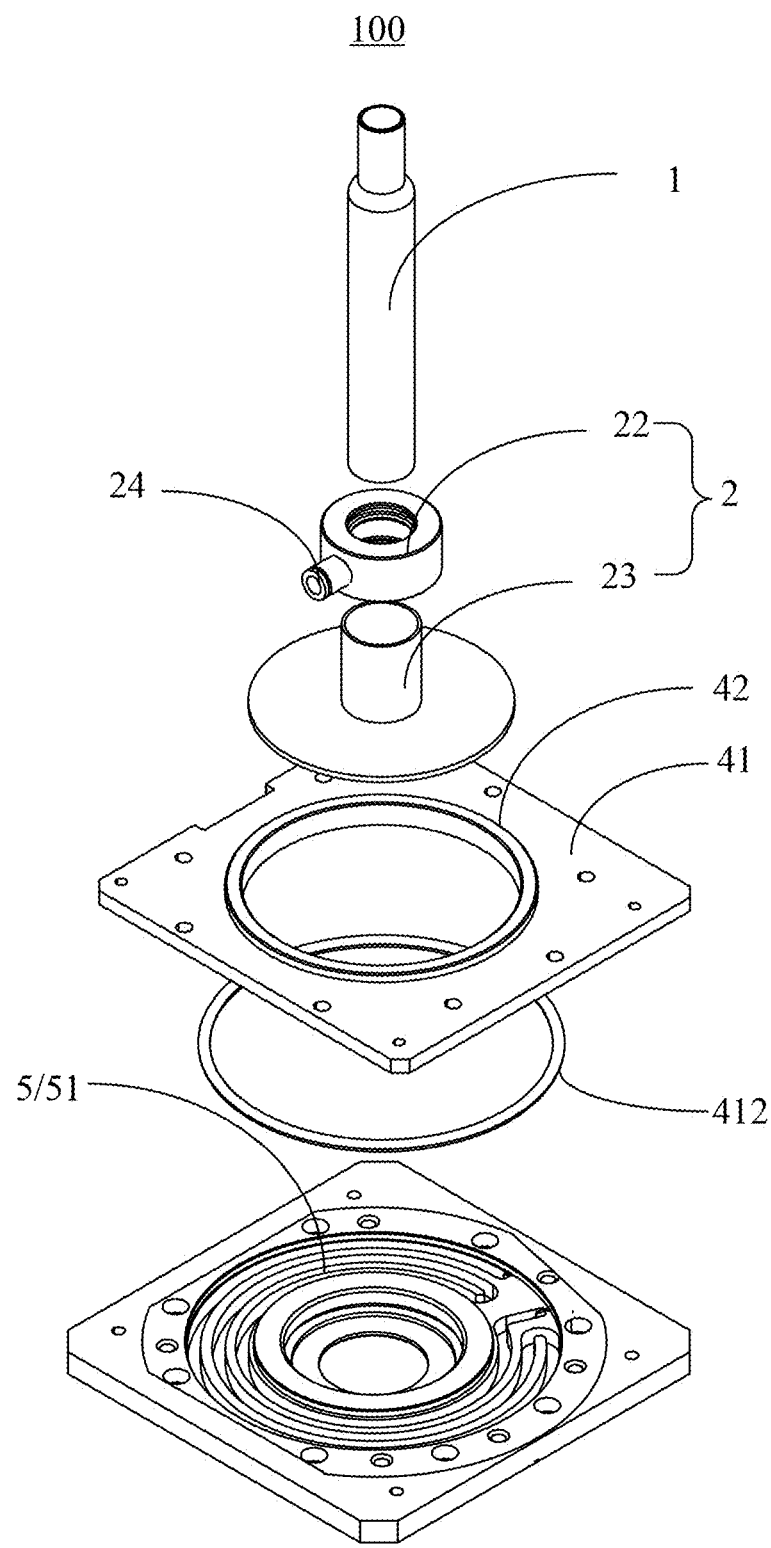
FIG. 2 is an exploded structural schematic diagram (including a sampling cone base (i.e., a base of a sampling cone)) of an oxygen reduction device in an ion source region of inductively coupled plasma in FIG. 1.
Figure 3:
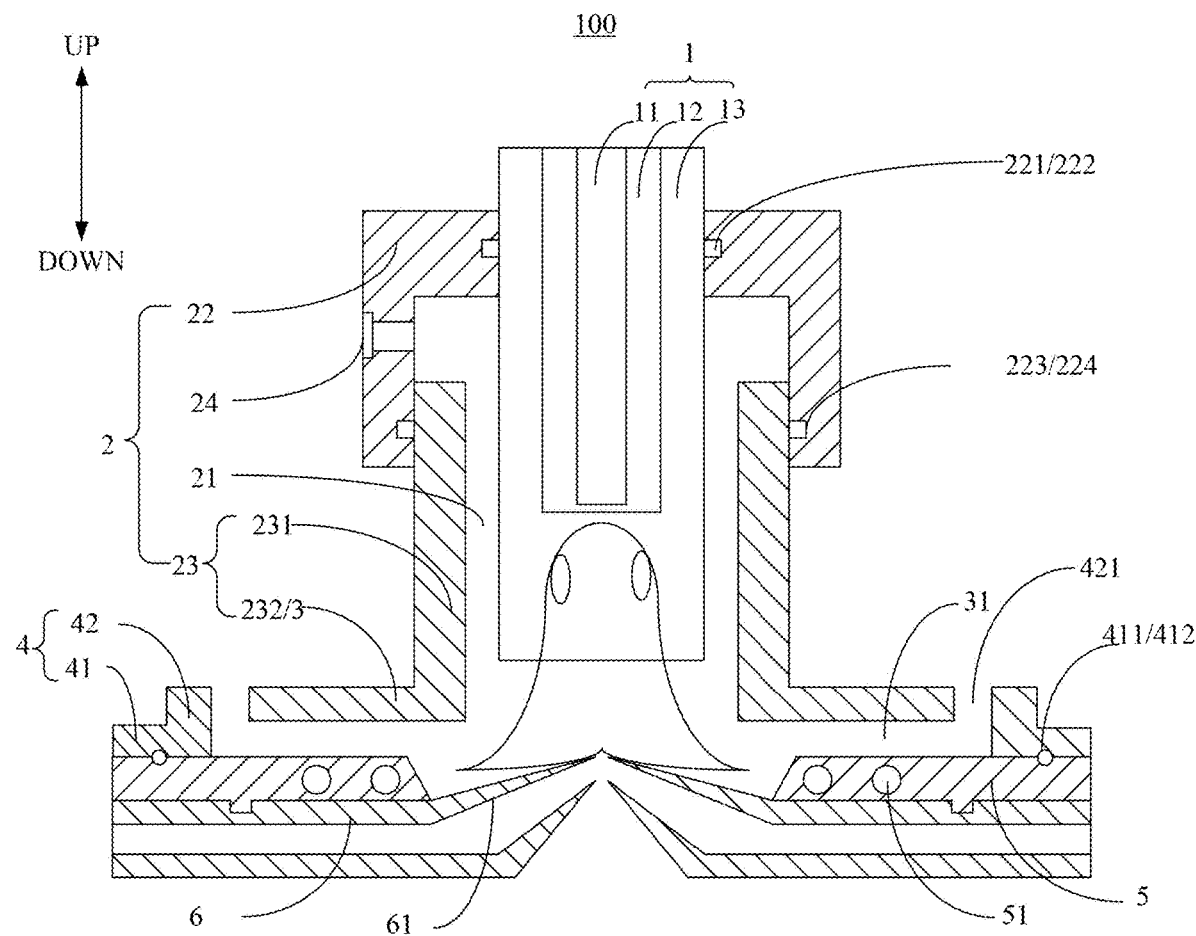
FIG. 3 is a sectional schematic diagram of an oxygen reduction device in an ion source region of inductively coupled plasma in FIG. 1.

Therefore, the present disclosure provides an oxygen reduction device in an ion source region of inductively coupled plasma and aims to solve the problem that the ion source region of an existing inductively coupled plasma source mass spectrometer is easily interfered with oxygen in the external environment to cause testing inaccuracy. FIG. 1 to FIG. 3 respectively illustrate structural schematic diagrams of an oxygen reduction device in an ion source region of inductively coupled plasma according to embodiments of the present disclosure. FIG. 4 to FIG. 7 respectively illustrate a signal distribution scatter diagram of elements to be measured, a two-dimensional schematic diagram of a pneumodynamics simulated speed field and a three-dimensional schematic diagram of a pneumodynamics simulated speed trajectory of an oxygen reduction device in an ion source region of inductively coupled plasma according to embodiments of the present disclosure.

Referring to FIG. 1 and FIG. 3, the oxygen reduction device 100 in an ion source region of inductively coupled plasma includes a torch 1 and an inflation sleeve 2. An upper end of the inflation sleeve 2 is sealedly sleeved outside the torch 1, and a lower end of the inflation sleeve 2 and the torch 1 are arranged at an interval to form an inflation gap 21. An inflation hole 24 communicating with the inflation gap 21 is formed in an outer side wall of the inflation sleeve 2. An outer side face of the lower end of the inflation sleeve 2 is protruded outwards to form an annular gas guiding protrusion 3. The annular gas guiding protrusion 3 is arranged opposite to a sampling cone base 6 arranged below the torch 1, and a gas outlet gap 31 is formed between the annular gas guiding protrusion 3 and the sampling cone base 6. Inert gas enters the inflation gap 21 from the inflation hole 24 and is discharged through the gas outlet gap 31 so as to surround an outer side of an ion source flame formed at a tail end of the torch 1.

In the technical solutions provided by the present disclosure, the inflation sleeve 2 is sleeved on the outer side of the torch 1, so that the torch 1 is wrapped with the ion source flame at the tail end in the inflation sleeve 2, the ion source region is effectively isolated from the external environment, and the interference on the test by oxygen element in the external environment is reduced to a certain extent. Meanwhile, inert gas is filled into the inflation gap 21 through the inflation hole 24, so that a pressure difference is generated between the ion source flame region and the external environment, and resistance on oxygen element in the external environment into the ion source flame region is caused. The ion source flame region is further isolated from the external environment by surrounding the ion source flame via the inert gas, the oxide yield is greatly reduced, and interference on testing is reduced. Meanwhile, the outer side face of the lower end of the inflation sleeve 2 is protruded outwards to form the annular gas guiding protrusion 3, so that the inert gas is extended to be ejected outwardly through the gas outlet gap 31, the distance that the interfered oxygen element in the external environment enters into the ion source flame region is increased, and the oxygen reduction effect is further improved. Based on the same reason, through the technical solutions provided by the present disclosure, the effect of reducing the interference of carbon, hydrogen and nitrogen elements in the external environment on the ion source flame can be achieved.

It needs to be noted that the specific structure and connected relation of the sampling cone base 6 refer to the conventional manner in the art and are not repeated here.

Further, the inert gas may be argon or helium. The oxygen barrier effect of helium is slightly higher than that of argon in tests requiring higher precision, but the cost of helium is relatively high. Thus, in the embodiment, the inert gas is the argon because argon has a good oxygen barrier effect and a low cost compared with helium, so that the economic cost can be reduced.

The inflation sleeve 2 and the torch 1 can be sealed in various forms. The inflation sleeve 2 and the torch 1 can be sealed through sealant bonding, and an also be sealed by setting a seal ring. However, due to the fact that the upper end of the inflation sleeve 2 is in a high temperature environment, seal failure is caused by volatilization of a sealant when the sealant bonding is used for sealing. Specifically, referring to FIG. 1 and FIG. 3, in the embodiment, a first annular seal groove 221 is formed in the inner side face of the upper end of the inflation sleeve 2, and a first annular seal ring 22 is adaptively arranged in the first annular seal groove 221 so as to seal the matching surfaces of both the inflation sleeve 2 and the torch 1. Through the arrangement, the sealing performance between the inflation sleeve 2 and the torch 1 is ensured, and the inflation sleeve 2 can be mounted, dismounted and replaced according to actual requirements. Meanwhile, the position at which the inflation sleeve 2 is sealed on the torch 1 can be adjusted. Then, the size of the gas outlet gap 31 can also be changed to accommodate the gas outlet gap 31 required for different plasma flames.

In order to further improve the oxygen reduction efficiency of the device, referring to FIG. 2 and FIG. 3, in the embodiment, the oxygen reduction device 100 in an ion source region of inductively coupled plasma further includes a flow restrictor 4, and the flow restrictor 4 includes a connecting ring 41 and a flow restricting ring 42. A lower end of the connecting ring 41 is connected to the sampling cone base 6, and a ring cavity of the connecting ring 41 is configured for the entry of a sampling cone 61. The flow restricting ring 41 is arranged on an upper end face of the connecting ring 41 and arranged on the circumference of the annular gas guiding protrusion 3 at an interval so as to form a flow restricting gap 421 extending in an up-down direction, and the flow restricting gap 421 communicates with the gas outlet gap 31. Through the arrangement, the inert gas is finally discharged from the flow restricting gap 421 to the external environment through the gas outlet gap 31. Therefore, the gas outlet gap 31 can be larger to cause a buffering effect on the inert gas, so as not to affect the ion source flame. Meanwhile, the flow restricting gap 421 extends in the up-down direction, so that heat generated by the ion source flame is discharged upwards along with the inert gas into the external environment, and does not continue to spread to the circumference. Therefore, the influence of high temperature on the sampling cone base 6 is reduced, and the service life of the sampling cone base 6 is prolonged.

Further, in the embodiment, the gap size of the flow restricting gap 421 is denoted by H, and a range of the size is larger than or equal to 0.5 mm and smaller than or equal to 1.0 mm. Through the arrangement, the smaller flow restricting gap 421 can ensure the pressure difference between the ion source region and the external environment, so that the inert gas is high in flow rate when passing through the flow restricting gap 421, the resistance of external gas into the ion source flame region can be increased, and the oxygen reduction effect is achieved.

Due to the effect of the flow restricting ring 42, the high-temperature inert gas after passing through the ion source flame is prevented from continuing to diffuse all around, and thus flow restricting ring 42 is required to be resistant to high temperature. In the embodiment, the flow restricting ring 42 is made of ceramics with good resistance to high temperature and oxidation, excellent chemical stability at high temperature, and thus the flow restricting ring 42 is not affected by the ion source flame and does not generate interfering elements to interfere with the tests.

In the actual operation process, the ion source flame is ejected onto the sampling cone base 6, and thus the temperature on the sampling cone base 6 is higher. In order to avoid that the sampling cone base 6 is subjected to the high-temperature ion source flame for a long time, referring to FIG. 2 and FIG. 3, in the embodiment, the oxygen reduction device 100 in an ion source region of inductively coupled plasma further includes a cooling plate 5. A lower end of the cooling plate 5 is attached to the sampling cone base 6, and a dodge through hole for an entry of the sampling cone 61 is formed in an upper end face of the cooling plate 5. A cooling coil 51 is provided within the cooling plate 5, and a water outlet end and a water inlet end of the cooling coil 51 penetrate through a side wall of the cooling plate 5. Through the arrangement, the ion source flame is directly ejected onto the cooling plate 5. The heat is taken away through the cooling coil 51 arranged inside the cooling plate 5, so that the influence of the high temperature the ion source flame on the sampling cone base 6 is effectively reduced.

Referring to FIG. 2 and FIG. 3, in the embodiment, the inflation sleeve 2 includes an inflation ring 22 and a shield cap 23. An upper end of the inflation ring 22 is sealedly sleeved outside the torch 1, and a lower end of the inflation ring 22 and the torch 1 are arranged at an interval. The inflation hole 24 is formed in the outer side wall of a lower end of the inflation ring 22. The shield cap 23 is of a cap-shaped structure. The shield cap 23 includes a cap body 231 and a cap peak 232. The cap body 231 is sleeved outside the torch 1, and the cap body 231 and the torch 1 are arranged at an interval. An upper end of the cap body 231 is in a sealing connection with the lower end of the inflation ring 22. The annular gas guiding protrusion is the cap peak 232. Through the arrangement, the inflation sleeve 2 includes two parts which respectively are the inflation ring 22 and the shield cap 23. When the shield cap 23 is damaged or does not work, the shield cap 23 can be replaced whereas the inflation sleeve 2 does not need to be replaced integrally, so that the service life of the inflation ring 22 is prolonged. Moreover, the assembling frequency of the inflation sleeve 2 and the torch 1 does not need to be increased correspondingly. Thus, the torch 1 or the inflation sleeve 2 is prevented from being damaged by operational errors of operators in the assembling process. Meanwhile, the shield caps 23 with different specifications can be replaced to form the inflation gaps 21 with different sizes, so that different ventilation requirements are met.

Further, in the embodiment, the inflation ring 22 is made of polyether-ether-ketone. The polyether-ether-ketone has good high-temperature resistance and electrical insulating property. Meanwhile, the polyether-ether-ketone is easy to be machined and shaped, and can be conveniently machined according to the torchs 1 with different specifications.

In another embodiment, the shield cap 23 is made of quartz. The quartz has good high-temperature resistance and electrical insulating property, can stably work in the high-temperature environment, and also can shield high-voltage discharge of the sampling base 6, so that the ion source flame is prevented from being influenced.

It needs to be noted that the two above-mentioned related limitations that "the inflation ring 22 is made of polyether-ether-ketone" and "the shield cap 23 is made of quartz" can be alternatively set, and can be set simultaneously. Apparently, the effect is higher when the two above-mentioned related limitations are set simultaneously.

A connection position relation between the shield cap 23 and the inflation ring 22 may be the upper end face of the shield cap 23 is in a sealing connection with the lower end face of the inflation ring 22, or the upper end of the shield cap 23 is sealedly sleeved on the outer side of the lower end of the inflation ring 22, or the upper end of the shield body 231 is sealedly sleeved on the inner side of the lower end of the inflation ring 22, as long as the cap body 231 and the torch 1 are arranged at an interval for inflation. Specifically, referring to FIG. 2 and FIG. 3, in the embodiment, the upper end of the cap body 231 is sealedly sleeved on the inner side of the lower end of the inflation ring 22. Through the arrangement, while the volume of the device is reduced, the gap between the cap body 231 and the inflation ring 22 can be the minimum, and the flow rate of the inert gas is the maximum. While it is ensured that the inert gas can surround the outer side of the ion source flame, the usage amount of the inert gas is reduced, and the usage cost of the inert gas is reduced.

Further, referring to FIG. 2 and FIG. 3, in the embodiment, a second annular seal groove 223 is formed in an inner side face of the lower end of the inflation ring 22, and a second annular seal ring 224 is adaptively arranged in the second annular seal groove 223 so as to seal a matching gap between the lower end of the inflation ring 22 and the upper end of the cap body 231. The inert gas is prevented from leaking out from the matching gap to ensure the inflation effect.

In the other embodiment, the inflation ring 22 is in threaded connection with the upper end of the cap body 231. While the sealing connection is ensured, the shield cap 23 can be screwed according to different detection requirements so as to change the size of the gas outlet gap 31.

Referring to FIG. 2 and FIG. 3, in one embodiment, the oxygen reduction device 100 in an ion source region of inductively coupled plasma further includes the flow restrictor 4 and the cooling plate 5. The lower end of the cooling plate 5 is attached to the sampling cone base 6, and a dodge through hole for the entry of the sampling cone 61 is formed in the upper end face of the cooling plate 5. The cooling coil 51 is provided within the cooling plate 5, and the water outlet end and the water inlet end of the cooling coil 51 penetrate through the side wall of the cooling plate 5. The flow restrictor 4 includes a connecting ring 41 and a flow restricting ring 42. The lower end face of the connecting ring 41 is in the sealing connection with the upper end face of the cooling plate 5. The ring cavity of the connecting ring 41 is configured for the entry of the sampling cone 61. The flow restricting ring 42 is arranged on the upper end face of the connecting ring 41 and arranged on the circumference of the annular gas guiding protrusion 3 at an interval so as to form a flow restricting gap 421 extending in the up-down direction, and the flow restricting gap 421 communicates with the gas outlet gap 31. Through the arrangement, the flow restricting ring 42 is additionally arranged in addition to the cooling plate 5, so that the influence of the high-temperature ion source flame on the sampling cone base 6 is greatly reduced.

Further, referring to FIG. 2 and FIG. 3, in the other embodiment, a third annular seal groove 411 is formed in the lower end face of the connecting ring 41, and a third annular seal ring 412 is adaptively arranged on the third annular seal groove 411. Through the arrangement, the sealing between the connecting ring 41 and the cooling plate 5 is ensured, and external gap is prevented from entering the ion source flame region through the assembling gap.

The following describes the oxygen reduction effect of the oxygen reduction device 100 in an ion source region of inductively coupled plasma with reference to the above-mentioned embodiments.

In the embodiment, an inductively coupled plasma mass spectrometry instrument with the model of EXPEC7000S is used. The radio frequency power of the ion source during working is 1600 W. The flow rates of carrier gas, auxiliary gas and cooling gas are respectively 1.294 L/min, 1 L/min and 14 L/min. The inflation ring 22 is connected with the torch 1 and the shield cap 23. The cooling plate 5 is mounted on the sampling cone base 66. The flow restrictor 4 is mounted on the mounting plate 5. The inert gas is argon.

$^{80}$ArAr is the artificially selected standard reference signal value that can be used for monitoring the stability of the instrument. $^{80}$ArAr is corrected through data processing, and $^{16}$O, $^{17}$O and $^{12}$C are corrected with reference to the corrected $^{80}$ArAr as a standard, so as to obtain a scatter distribution diagram. For $^{18}$O, due to possible interference from $^{36}$Ar+, the reduction trend is not obvious, so it is not used for contrasting.

After the torch 1 is successfully ignited, when the iron source works normally, the instrument is stabilized for 15-30 min, and the signal intensities of $^{16}$O, $^{17}$O, $^{12}$C, $^{80}$ArAr and the like are monitored.

Figure 4:
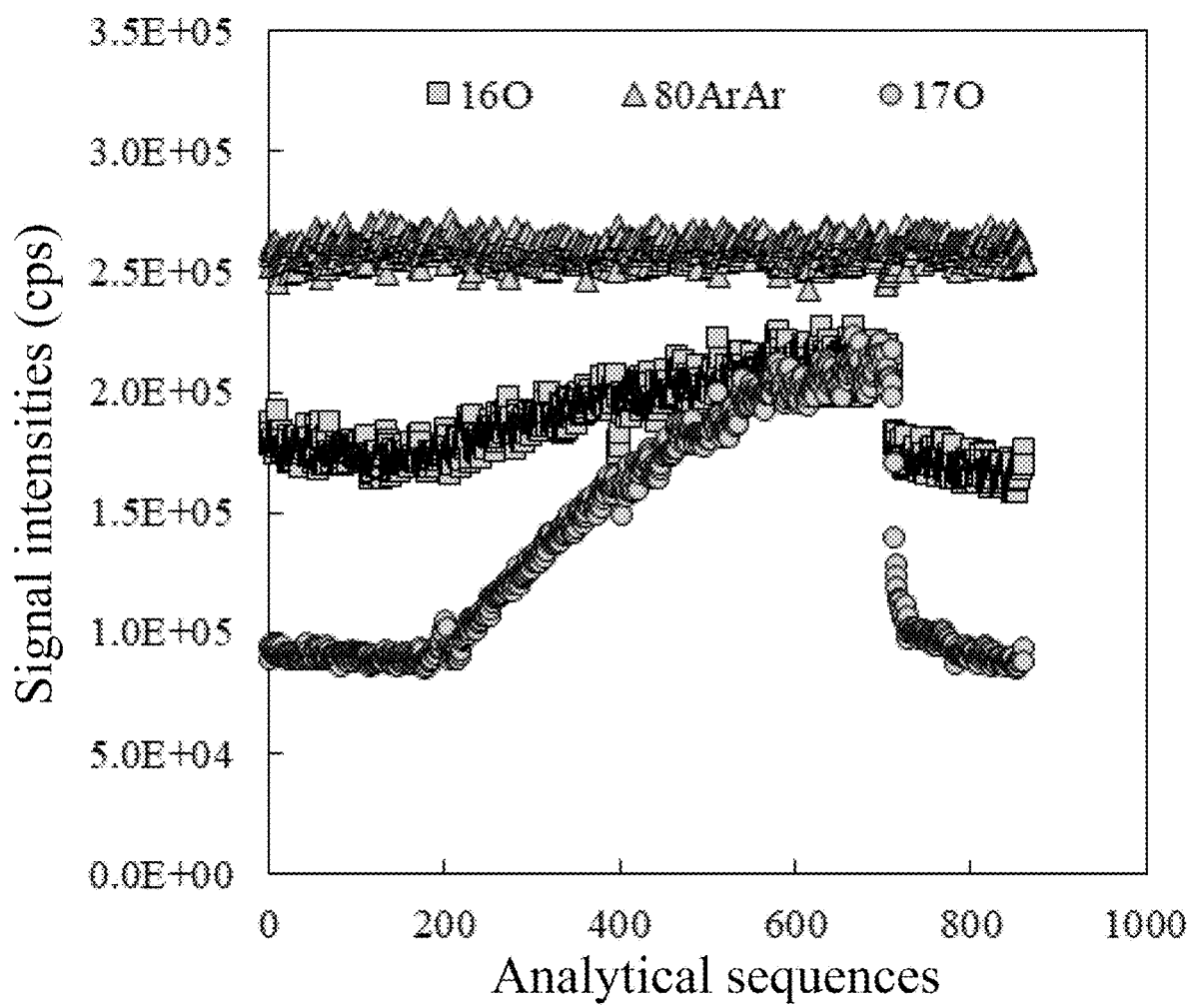
FIG. 4 is a time-varying scatter diagram of $^{16}O$, $^{17}O$ and $^{80}ArAr$ signal intensities in an oxygen reduction device in an ion source region of inductively coupled plasma in FIG. 1.
Figure 5:
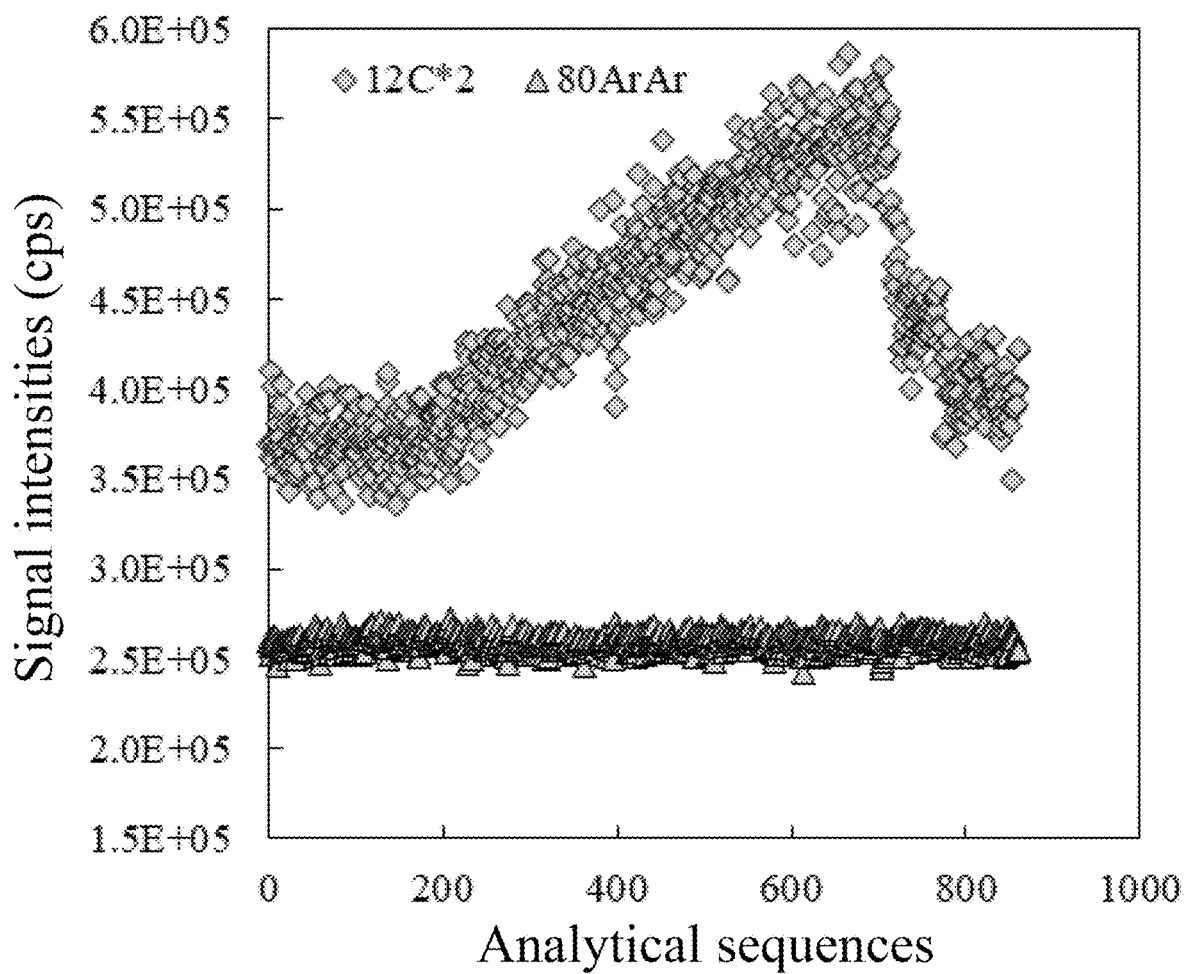
FIG. 5 is a time-varying scatter diagram of $^{12}C$ and $^{80}ArAr$ signal intensities in an oxygen reduction device in an ion source region of inductively coupled plasma in FIG. 1.

Referring to FIG. 4 and FIG. 5, the argon is introduced into the inflation hole 24 in the inflation ring 22 at a flow rate of 10 L/min and waits for the argon to be stable. It can be seen that the signals of $^{16}$O, $^{17}$O and $^{12}$C are kept at low levels and are stable when the analytical sequences are 0 to 200.

When the analytical sequence is 200, the argon is stopped being introduced. It can be seen that the signals of $^{16}$O, $^{17}$O and $^{12}$C are gradually increased after the analytical sequence is larger than 200. The partial pressures of $O_2$ and $CO_2$ concentrations in the external air are larger than that of a region surrounded by the shield cap 23 and the flow restricting ring 42. Therefore, the signals of $^{16}$O, $^{17}$O and $^{12}$C are gradually enhanced due to the diffusion effect.

When the analytical sequence is 700, the argon continues to be introduced. It can be seen that the signals of $^{16}$O, $^{17}$O and $^{12}$C are obviously weakened after the analytical sequence is larger than 700 (the signal strengths of oxygen and carbon are changed in such a manner that $^{16}$O is weakened by about 26%, $^{17}$O is weakened by about 60% and $^{12}$C is weakened by about 32%).

Figure 6:
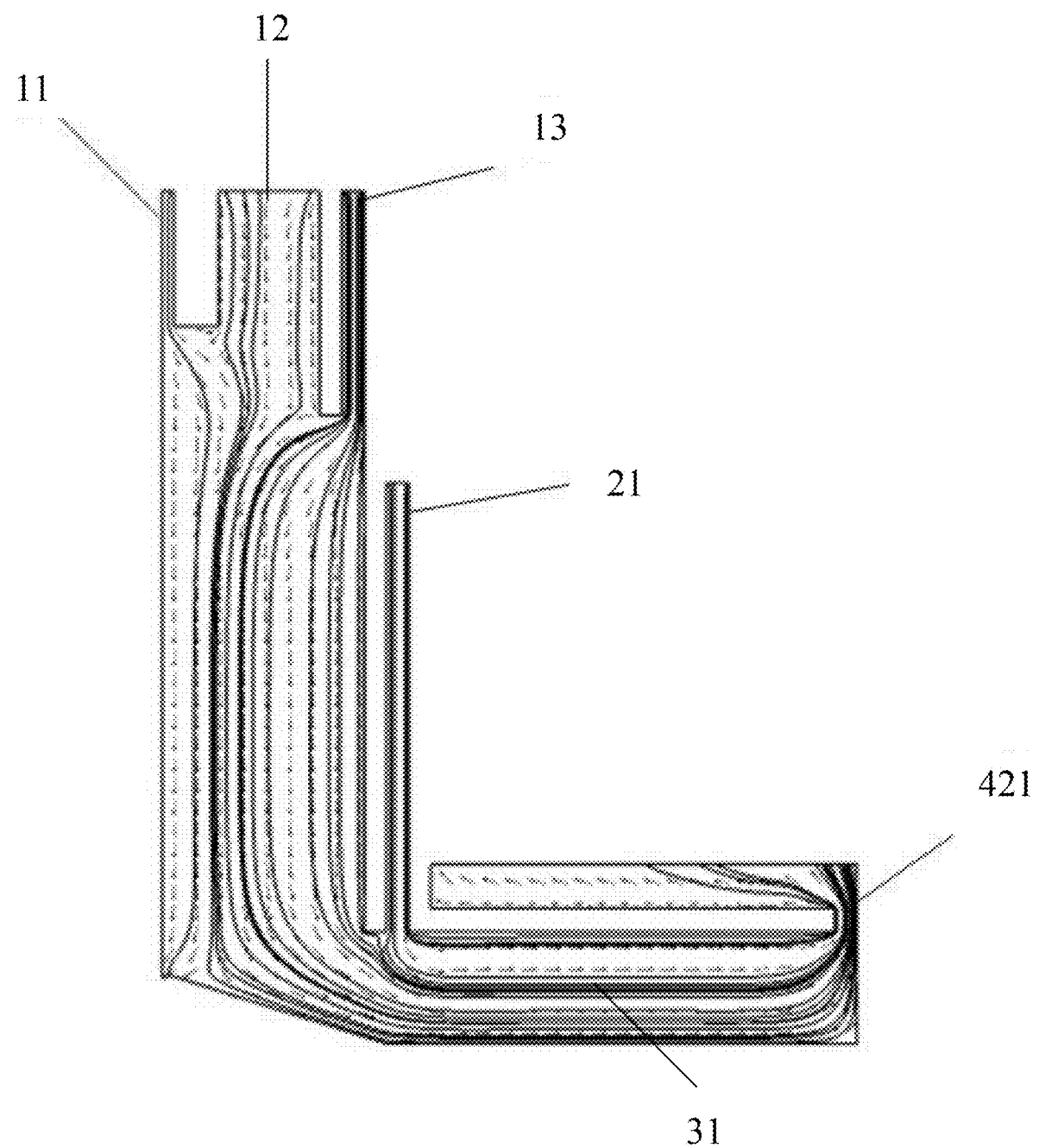
FIG. 6 is a two-dimensional schematic diagram of a pneumodynamics simulated speed field in an oxygen reduction device in an ion source region of inductively coupled plasma in FIG. 1.
Figure 7:
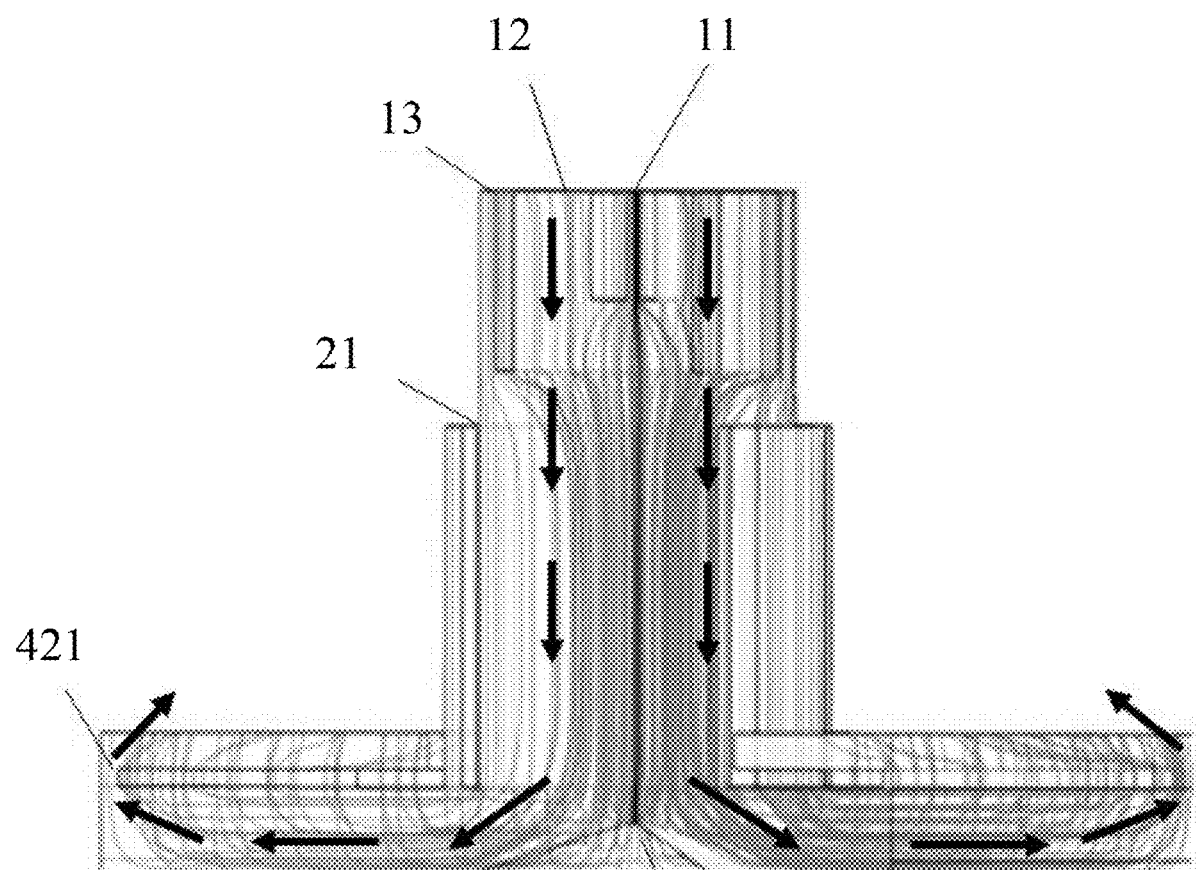
FIG. 7 is a three-dimensional schematic diagram of a pneumodynamics simulated speed trajectory in an oxygen reduction device in an ion source region of inductively coupled plasma in FIG. 1.

In order to further analyze the weakening reason of the oxygen signal, referring to FIG. 6 and FIG. 7, the pneumodynamics simulation is performed on the oxygen reduction device 100 in an ion source region of inductively coupled plasma by using COMSOL Multiphysics software. The speed field distribution condition of a two-dimensional partial cross section region in an inflation environment inside the oxygen reduction device 100 in an ion source region of inductively coupled plasma is as shown in FIG. 6 (the model is a rotationally symmetrical model, and therefore, only one cross section is used for simulation). The distribution model of a three-dimensional gas flow field in an inflation environment inside the oxygen reduction device 100 in an ion source region of inductively coupled plasma is as shown in FIG. 7. The results show that the gas in the flow restricting gap 421 in the oxygen reduction device 100 in an ion source region of inductively coupled plasma is high in speed, and the gas flow lines are dense at the position of the flow restricting gap 421. That is, when the gas passes through the flow restricting gap 421, the speed is higher, and the resistance can be generated when oxide in the external air enters the flow restricting gap 421, so that the experimental result is further verified.

Thus, it can be concluded that an effective oxygen reduction in the ion source region of inductively coupled plasma can be achieved by using the oxygen reduction device 100 in an ion source region of inductively coupled plasma.

The above are only the embodiments of the present disclosure and not intended to limit the protection scope of the present disclosure, and any equivalent transformations based on the specification and the drawings of the present disclosure, or direct/indirect application in other related technical fields, shall similarly fall within the scope of patent protection of the present disclosure.

What is claimed is:
1. An oxygen reduction device in an ion source region of inductively coupled plasma, comprising:
a torch, and
an inflation sleeve, wherein an upper end of the inflation sleeve is sealedly sleeved outside the torch, and a lower end of the inflation sleeve and the torch are arranged at an interval to form an inflation gap; an inflation hole communicating with the inflation gap is formed in an outer side wall of the inflation sleeve; an outer side face of the lower end of the inflation sleeve is protruded outwards to form an annular gas guiding protrusion; the annular gas guiding protrusion is arranged opposite to a base of a sampling cone arranged below the torch, and a gas outlet gap is formed between the annular gas guiding protrusion and the base of the sampling cone;
wherein, inert gas enters the inflation gap from the inflation hole and is discharged through the gas outlet gap to surround an outer side of an ion source flame formed at a tail end of the torch;
the oxygen reduction device in an ion source region of inductively coupled plasma further comprises: a flow restrictor, and the flow restrictor comprises:

a connecting ring, a lower end of the connecting ring is connected to the base of the sampling cone, and a ring cavity of the connecting ring is used for an entry of the sampling cone; and a flow restricting ring arranged on an upper end face of the connecting ring and arranged on a circumference of the annular gas guiding protrusion at an interval so as to form a flow restricting gap extending in an up-down direction, and the flow restricting gap communicates with the gas outlet gap;

the oxygen reduction device in an ion source region of inductively coupled plasma further comprises: a cooling plate, a lower end of the cooling plate is attached to the base of the sampling cone, and an avoidance through hole for an entry of the sampling cone is formed in an upper end face of the cooling plate; and the cooling plate is internally provided with a cooling coil, and a water outlet end and a water inlet end of the cooling coil penetrate through a side wall of the cooling plate;

wherein, the connecting ring is arranged on the upper end face of the cooling plate.

2. The oxygen reduction device in an ion source region of inductively coupled plasma according to claim 1, wherein a first annular seal groove is formed in an inner side face of the upper end of the inflation sleeve, and a first annular seal ring is adaptively arranged in the first annular seal groove to seal matching surfaces of both the inflation sleeve and the torch.

3. The oxygen reduction device in an ion source region of inductively coupled plasma according to claim 1, wherein a size of the flow restricting gap is denoted by H, and a range of the size is larger than or equal to 0.5 mm and smaller than or equal to 1.0 mm.

4. The oxygen reduction device in an ion source region of inductively coupled plasma according to claim 1, wherein the flow restricting ring is made of ceramics.

5. The oxygen reduction device in an ion source region of inductively coupled plasma according to claim 1, wherein the inflation sleeve comprises:

an inflation ring, an upper end of the inflation ring is sealedly sleeved outside the torch, a lower end of the inflation ring and the torch are arranged at an interval, and the inflation hole is formed in an outer side wall of the lower end of the inflation ring; and a shield cap, the shield cap is of a cap-shaped structure, the shield cap comprises a cap body and a cap peak, the cap body is sleeved outside the torch, the cap body and the torch are arranged at an interval, an upper end of the cap body is in a sealing connection with the lower end of the inflation ring, and the annular gas guiding protrusion is the cap peak.

6. The oxygen reduction device in an ion source region of inductively coupled plasma according to claim 5, wherein the inflation ring is made of polyether-ether-ketone; and/or the shield cap is made of quartz.

7. The oxygen reduction device in an ion source region of inductively coupled plasma according to claim 5, wherein the upper end of the cap body is sealedly sleeved on an inner side of the lower end of the inflation ring.

8. The oxygen reduction device in an ion source region of inductively coupled plasma according to claim 7, wherein a second annular seal groove is formed in an inner side face of the lower end of the inflation ring, and a second annular seal ring is adaptively arranged in the second annular seal groove to seal a matching gap between the lower end of the inflation ring and the upper end of the cap body.

\* \* \* \* \*